(12) United States Patent
Demir et al.

(10) Patent No.: US 7,376,200 B2
(45) Date of Patent: May 20, 2008

(54) METHOD AND APPARATUS FOR SUPPRESSING CARRIER LEAKAGE (75) Inventors: Alpaslan Demir, Commack, NY (US); Leonid Kazakevich, Plainview, NY (US); Tanbir Haque, Long Island City, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 775 days.

(21) Appl. No.: 10/739,844

(22) Filed: Dec. 18, 2003

(65) Prior Publication Data

US 2004/0252782 A1 Dec. 16, 2004

Related U.S. Application Data

(60) Provisional application No. 60/476,748, filed on Jun. 6, 2003.

(51) Int. Cl.
*H04K 1/02* (2006.01)
*H04B 17/00* (2006.01)

(52) U.S. Cl. .................. 375/296; 375/295; 375/225; 455/67.11; 455/67.13

(58) Field of Classification Search ............ 375/225, 375/281, 284, 295, 296, 298; 455/63.1, 126, 455/205, 296, 67.11, 67.13
See application file for complete search history.

(56) References Cited

U.S. PATENT DOCUMENTS 5,119,399 A * 6/1992 Santos et al. ............. 375/224

| | | | |
|---|---|---|---|
| 5,404,378 A * | 4/1995 | Kimura ..................... 375/296 |
| 5,584,059 A * | 12/1996 | Turney et al. ............. 455/126 |
| 5,731,772 A | 3/1998 | Mikkola et al. |
| 6,222,878 B1 * | 4/2001 | McCallister et al. ...... 375/225 |
| 6,225,848 B1 * | 5/2001 | Tilley et al. .............. 327/307 |
| 6,317,064 B1 * | 11/2001 | Ferrer et al. .............. 341/118 |
| 6,373,902 B1 * | 4/2002 | Park et al. ................ 375/296 |
| 6,803,867 B1 * | 10/2004 | Juang ....................... 341/118 |
| 6,980,774 B2 * | 12/2005 | Shi ............................. 455/73 |
| 7,133,644 B2 * | 11/2006 | Demir et al. ............ 455/67.11 |
| 2003/0199264 A1 * | 10/2003 | Holenstein et al. ....... 455/324 |
| 2004/0043744 A1 * | 3/2004 | Schlegel et al. .......... 455/324 |
| 2004/0162104 A1 * | 8/2004 | Ozluturk et al. ........ 455/550.1 |
| 2004/0248516 A1 * | 12/2004 | Demir et al. ............. 455/63.1 |
| 2006/0094386 A1 * | 5/2006 | Darabi et al. ............. 455/296 |
| 2007/0010223 A9 * | 1/2007 | Demir et al. ............. 455/205 |

FOREIGN PATENT DOCUMENTS

| EP | 1 271 815 | 1/2003 |
|---|---|---|
| KR | 10-2006-0064603 | 6/2006 |
| WO | 01/24389 | 4/2001 |

* cited by examiner

*Primary Examiner*—Mohammed Ghayour
*Assistant Examiner*—Lawrence Williams
(74) *Attorney, Agent, or Firm*—Volpe and Koenig, P.C.

(57) ABSTRACT

A method and system for determining at least one DC offset compensation value used to suppress carrier leakage occurring on real and imaginary signal paths in an analog radio transmitter when a significant temperature change in the transmitter is detected. At least one DC offset signal having a level that corresponds to the at least one DC offset compensation value is provided to a digital DC offset compensation module which adjusts the DC level of at least one of the real and imaginary signal paths.

45 Claims, 4 Drawing Sheets

METHOD AND APPARATUS FOR SUPPRESSING CARRIER LEAKAGE

CROSS REFERENCE TO RELATED APPLICATION

This application claims priority from U.S. Provisional Patent Application Ser. No. 60/476,748, filed Jun. 6, 2003, which is incorporated by reference as if fully set forth herein.

FIELD OF THE INVENTION

The present invention generally relates to transmitter design in wireless communication systems. More particularly, the present invention relates to digital signal processing (DSP) techniques used to compensate for carrier leakage introduced in an analog radio transmitter.

BACKGROUND

Existing wireless system architectural configurations impose stringent constraints on the system designer with regards to transmitting communication signals. Moreover, such configurations often provide low reliability communication links, high operating costs, and an undesirably low level of integration with other system components.

In the radio frequency (RF) section of a conventional low-cost wireless transmitter configured with analog components, a considerable level of distortion occurs when RF signals are processed. Higher cost components with better distortion characteristics that enhance signal quality may be overlooked during the design phase in order to reduce the cost of the end-product.

For example, a common problem associated with conventional wireless communication systems is that a local oscillator (LO) signal, used for the modulator of an analog radio transmitter, leaks to the output of an RF power amplifier in the transmitter. This LO leakage is caused by suboptimal isolation of the LO with respect to analog circuit components in the transmitter, as well as an unavoidable direct current (DC) offset voltage at the mixer stage of the modulator due to mismatches and imperfections in the analog circuit components.

There are several reasons for suppressing carrier leakage. Technical specifications for many mobile communication systems, including universal mobile telecommunications system (UMTS), define a mask which sets forth the maximum permissible radiated signal energy as a function of frequency. Radiated signals that do not fall within the mask may violate existing Federal Communications Commission (FCC) or other rules governing spurious emissions, and may disrupt services provided by the communication systems. Moreover, an unwanted carrier component at the output of the RF power amplifier can degrade the linearity of the RF power amplifier, due to the presence of increased signal levels.

In transmitters and transceivers that employ heterodyne circuitry, LO feedthrough can be dramatically reduced through the use of proper frequency planning and filtering. However, in broadband systems, the RF and LO bands often overlap. For homodyne transmitters, the RF and LO bands virtually always overlap.

There are several current methods which exist to suppress LO leakage, including those that utilize RF parameter balancing techniques. However, practical component tolerances rarely permit more than approximately 30 dB of carrier leakage suppression.

Another technique of adding a correctly leveled and phase-shifted part of the LO signal to the RF signal has the disadvantage of requiring very complex mixers.

Because the costs of components that process RF analog signals are higher than the components that use DSP, it is desired to provide a digital baseband (DBB) system, including a low cost transmitter with low noise and minimal power requirements, that utilizes DSP techniques to provide an improved and less complex method and system for suppressing carrier leakage in an analog radio transmitter.

SUMMARY

A method and system used to determine at least one DC offset compensation value used to suppress carrier leakage occurring on real and imaginary signal paths in an analog radio transmitter when a significant temperature change in the transmitter is detected. At least one DC offset signal having a level that corresponds to the at least one DC offset compensation value is provided to a digital DC offset compensation module which adjusts the DC level of at least one of the real and imaginary signal paths.

The present invention may be incorporated into a DBB transmitter, a WTRU, an IC, a wireless communication system and method, or any other desired communication mechanism. The present invention includes an analog radio transmitter having real and imaginary signal inputs, a digital DC offset compensation module in communication with the analog radio transmitter and having real and imaginary signal inputs, and a controller. The digital DC compensation module is configured to adjust the DC level of at least one of the real and imaginary signal inputs. The controller is in communication with the digital DC offset compensation module. The controller is configured to determine at least one DC offset compensation value used to suppress carrier leakage occurring in the analog radio transmitter. The controller provides at least one DC offset signal to at least one of the real and imaginary signal inputs having a level that corresponds to the at least one DC offset compensation value.

The present invention may further include a memory in communication with the controller. The memory stores the at least one DC offset compensation value. The analog radio transmitter may further include a temperature sensor in communication with the controller. The controller determines the at least one DC offset compensation value if the temperature sensor detects a change in temperature greater than a predetermined threshold, or a temperature excursion beyond a predetermined value or range. The present invention may process communication signals which include first and second time slots separated by a guard period. The controller determines the at least one DC offset compensation value during at least a portion of the guard period.

The present invention may include a modem selectively connected to the real and imaginary signal inputs of the digital DC offset compensation module. The modem may have real and imaginary signal outputs. The present invention may further include first and second switches respectively connected to the real and imaginary signal outputs of the modem, the real and imaginary signal inputs of the digital DC offset compensation module and the controller. The at least one DC offset compensation value is determined after the switches disconnect the modem from the real and imaginary signal inputs of the digital DC offset compensation module and connect the controller to the real and imaginary signal inputs of the digital DC offset compensation module.

The digital DC offset compensation module may include a first adder having a first input coupled to the real signal input of the digital DC offset compensation module and a second input coupled to the controller. The second adder may have a first input coupled to the imaginary signal input of the digital DC offset compensation module and a second input coupled to the controller. The controller may provide respective DC offset signals to the second inputs of the first and second adders. The respective DC offset signals may have levels which respectively correspond to a first and second DC offset compensation value determined by the controller.

The controller may set previously determined DC offset compensation values to zero, prior to determining the at least one DC offset compensation value. The analog radio transmitter comprises an amplifier, wherein the controller sets the amplifier to a maximum gain level, prior to determining the at least one DC offset compensation value.

The controller may disable the imaginary signal input of the digital DC offset compensation module and apply a set of different DC offset voltages to the real signal input of the digital DC offset compensation module. Furthermore, the controller may disable the real signal input of the digital DC offset compensation module and apply a set of different DC offset voltages to the imaginary signal input of the digital DC offset compensation module.

Each set of different DC offset voltages may be applied in accordance with a substantially parabolic function, and the controller may perform an interpolation of at least three measurement points on the parabolic function to determine a minimum detected reading associated with a minimum value of the parabolic function. The controller may determine the DC offset compensation value based on the minimum detected reading.

The analog radio transmitter may include a modulator having a local oscillator (LO) for outputting an LO signal at an LO frequency, and the minimum detected reading is determined for either the real or imaginary signal input at the LO frequency.

BRIEF DESCRIPTION OF THE DRAWING(S)

A more detailed understanding of the invention may be had from the following description of a preferred example, given by way of example and to be understood in conjunction with the accompanying drawing wherein.

DETAILED DESCRIPTION OF THE PREFERRED EMBODIMENTS

Figure 1:
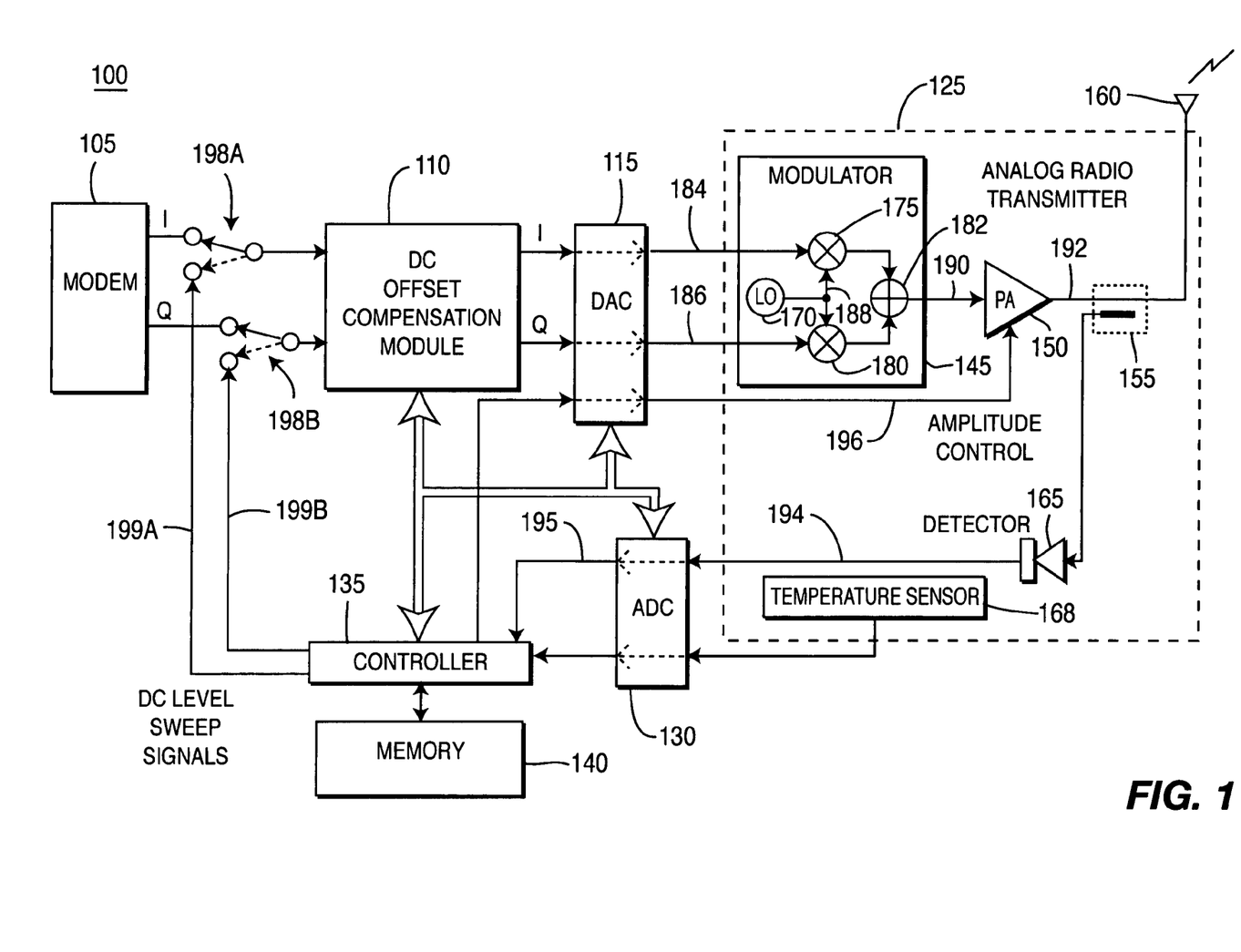
FIG. 1 is a block diagram of a DBB RF transmitter with a digital DC offset compensation module configured in accordance with a preferred embodiment of the present invention.

FIG. 1 is a block diagram of a DBB RF transmitter 100, configured in accordance with a preferred embodiment of the present invention. Although the invention will be referred to in terms of being implemented upon a transmitter 100, it should also be understood by those of skill in the art that the invention pertains equally to a transceiver. However, for simplicity, the invention will be described in terms of being implemented upon a transmitter 100.

Preferably, the method and system disclosed herein is incorporated into a wireless transmit/receive unit (WTRU). Hereafter, a WTRU includes but is not limited to a user equipment, mobile station, fixed or mobile subscriber unit, pager, or any other type of device capable of operating in a wireless environment. The features of the present invention may be incorporated into an integrated circuit (IC) or be configured in a circuit comprising a multitude of interconnecting components.

The present invention is applicable to communication systems using time division duplex (TDD), time division multiple access (TDMA), frequency division duplex (FDD), code division multiple access (CDMA), CDMA 2000, time division synchronous CDMA (TDSCDMA), and orthogonal frequency division multiplexing (OFDM). However, the present invention is envisaged to be applicable to other types of communication systems as well.

As shown in FIG. 1, the DBB RF transmitter 100 includes a modem 105, a digital direct current (DC) offset compensation module 110, a least one digital to analog converter (DAC) 115, an analog radio transmitter 125, at least one analog to digital converter (ADC) 130, a controller 135 and a read-write memory 140.

The analog radio transmitter 125 includes a modulator 145, a power amplifier (PA) 150, a coupling unit (e.g., a directional coupler or sample transmission line) 155, an antenna 160, a detector 165 and a temperature sensor 168.

The modulator 145 of the analog radio transmitter 125 includes an LO 170, first and second modulators 175, 180, and an adder 182.

In the DBB RF transmitter 100, the modem 105 outputs in-phase (I) and quadrature (Q) signal components to the DAC 115 via the digital DC offset compensation module 110. Based on the I and Q signal components, the DAC 115 outputs an analog real signal 184 to the first modulator 175, and an analog imaginary signal 186 to the second modulator 180. The LO 170 of the modulator 145 provides an LO input signal 188 to each of the first and second modulators 175, 180. The outputs of the first and second modulators 175, 180 are summed together by the adder 182 to generate an analog complex modulated signal 190 which is input to the PA 150. In response to receiving the analog complex modulated signal 190, the PA 150 outputs a transmitter output signal 192, which is output from antenna 160 of the analog radio transmitter 125. The transmitter output signal 192 is monitored by the detector 165 via the coupling unit 155. The detector 165 generates a feedback signal 194 which provides a detected reading having a magnitude that is a function of the transmitter output signal 192.

The ADC 130 receives the feedback signal 194 and outputs a digital signal 195 to the controller 135. The controller 135 also provides an amplitude control signal 196 to PA 150 to control the amplitude of the transmitter output signal 192. Furthermore, the controller 135 controls the operation of the DAC 115 and the ADC 130 based on various values stored in the memory 140.

The DBB RF transmitter 100 further includes switches 198A and 198B which are coupled to the modem 105 and the controller 135. During normal operation, the switches 198A and 198B couple the I and Q signal outputs of the modem 105 to the respective I and Q signal inputs of the digital DC offset compensation module 110. When it is necessary to perform a DC offset compensation adjustment procedure, the controller 135 signals the switches 198A and 198B to connect the I (real) and Q (imaginary) signal inputs of the digital DC offset compensation module 110 to the controller 135, such that the controller 135 may inject various DC offset voltages into the real and imaginary inputs of the digital DC offset compensation module 110, via DC level sweep signals 199A and 199B. Based on the DC offset voltages input by the controller 135 via DC level sweep signals 199A and 199B, a respective minimum detected reading is determined by the controller 135 based on the digital signal 195. The first and second DC offset compensation values, $K_1$ and $K_2$, are determined based on the detected readings and are used to adjust the DC levels of the I and Q signal components throughout the DBB RF transmitter 100.

Figure 2:
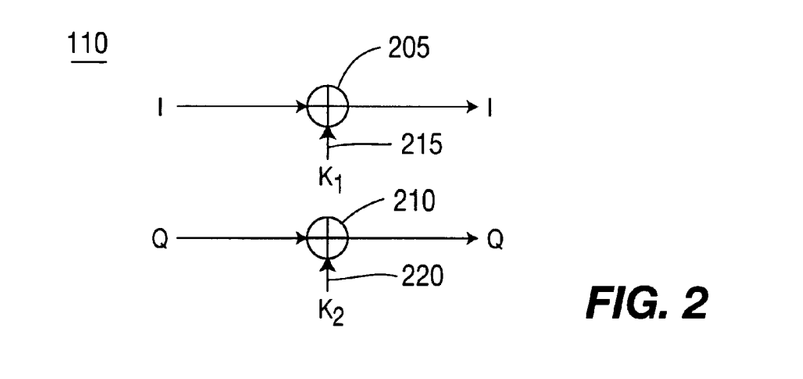
FIG. 2 shows an exemplary configuration of the digital DC offset compensation module in the DBB RF transmitter of FIG. 1.

FIG. 2 shows an exemplary configuration of the digital DC offset compensation module 110 used to eliminate carrier leakage by canceling out undesired DC offsets. The digital DC offset compensation module 110 includes adders 205 and 210 which receive I and Q signal components, respectively, and adjust their DC level characteristics by adding respective DC offset signals 215, 220 having levels corresponding to the DC offset compensation values $K_1$ and $K_2$. The DC offset compensation values $K_1$ and $K_2$ may be derived by the controller 135 performing various algorithms, functions and/or interpolations on data provided by the digital signal 195. The values of $K_1$ and $K_2$ are determined by the controller 135 initiating a DC offset (carrier leakage) compensation adjustment procedure. DC offset signals 215, 220 having levels corresponding to the values of $K_1$ and $K_2$ are provided to the digital DC offset compensation module 110 by the controller 135 and are then added to the I and Q signal components via the adders 205, 210, respectively.

Figure 3:
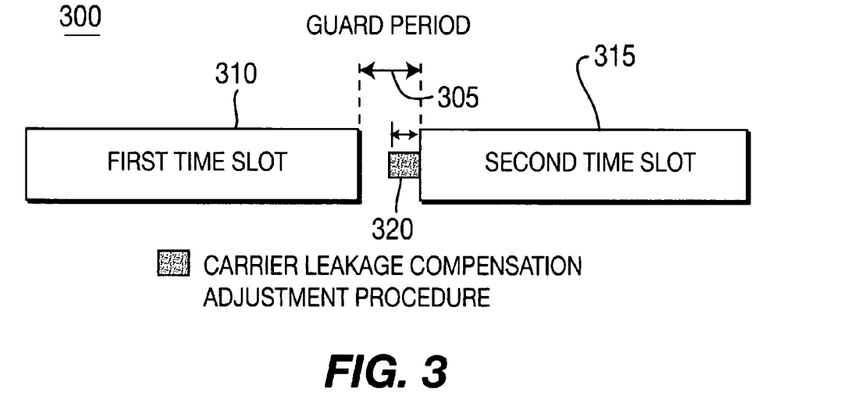
FIG. 3 illustrates an example of a communication signal processed by the DBB RF transmitter of FIG. 1.

FIG. 3 illustrates an example of a communication signal 300 having a guard period 305 which occurs between two time slots 310, 315. This exemplary communication signal may be used under the presumption that the DBB RF transmitter 100 is a TDD, TDMA, TDSCDMA or other time-slotted transmitter. In this example, data in the communication signal 300 is communicated via the time slots 310 and 315. Thus, the only time that adjustments for carrier leakage compensation may be performed without disrupting the data in the time slots 310, 315, of communication signal 300, is during at least a portion of one or more guard periods, such as guard period 305. In accordance with one embodiment of the present invention, a carrier leakage compensation adjustment procedure 320 may be performed during at least a portion of one or more of subsequent guard periods 305.

Figure 4:
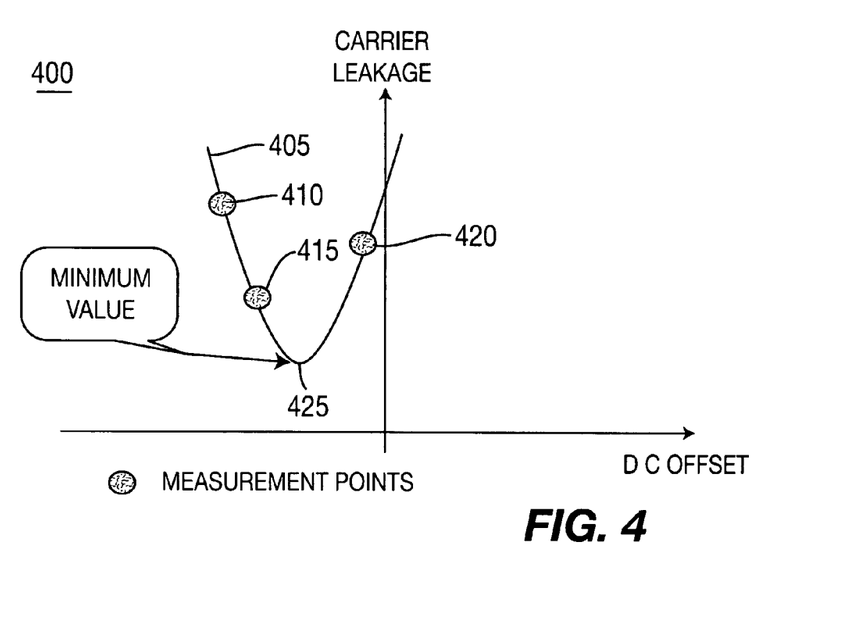
FIG. 4 is a graph showing a parabolic function of carrier leakage versus DC offset used to determine at least one DC offset compensation value for adjusting the digital DC offset compensation module of FIG. 2.

FIG. 4 is a graph 400 showing carrier leakage versus DC offset as applied to the DBB RF transmitter 100 of FIG. 1. In one embodiment of the present invention, the various DC offset voltages provided by the DC level sweep signals 199A, 199B, may be generated according to a substantially parabolic function 405 of DC offset versus carrier leakage, based on the values of at least three detected readings which correspond to measured points 410, 415 and 420 of the parabolic function 405. Although the parabolic function 405 of FIG. 4 is shown for illustrative purposes as a generic parabolic function, parabolic-like or even non-parabolic functions could also be employed. The function employed will depend upon the type of detector 165 used in the analog radio transmitter 125.

A minimum detected reading based on the value of a minimum point 425 of the substantially parabolic function 405 is determined for each of the real and imaginary signal components I and Q. The value of the minimum point 425 may be interpolated based on detected readings associated with at least three measured points 410, 415 and 420 on the parabolic function 405. Thereafter, the controller 135 provides respective DC offset voltages to the adders 205, 210, of the digital DC offset compensation module 110 for combination with the respective signal input components I and Q.

Figure 5A:
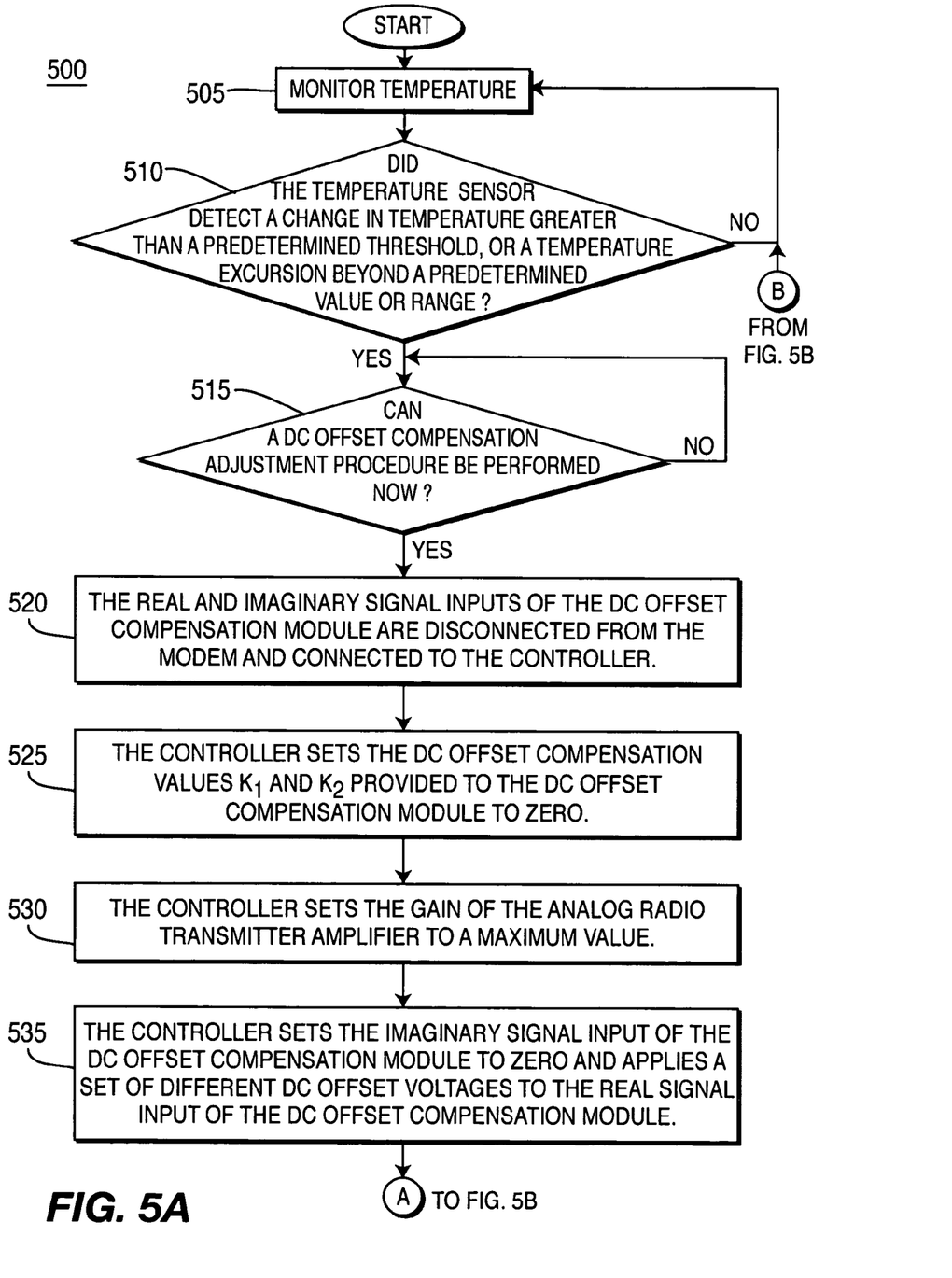
FIGS. 5A and 5B, taken together, are a flow chart of a process including method steps used to determine at least one DC offset compensation value for adjusting the digital DC offset compensation module of FIG. 2.
Figure 5B:
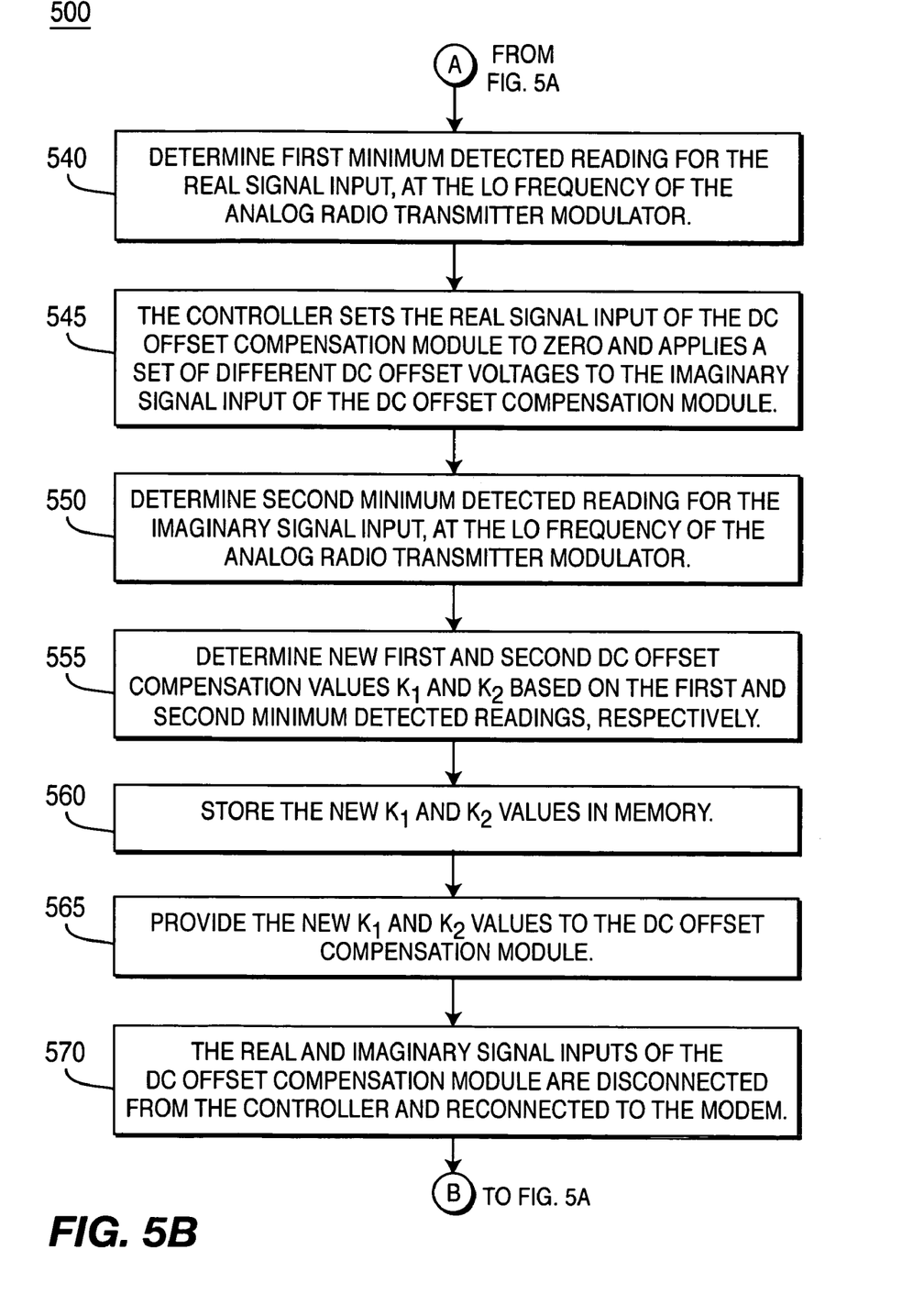

FIGS. 5A and 5B, taken together, are a flow chart of an exemplary process 500 which includes method steps used to determine at least one DC offset compensation value for adjusting the digital DC offset compensation module 110 in accordance with a preferred embodiment of the present invention. In step 505, the temperature of the analog radio transmitter 125 or a particular component therein is monitored by the temperature sensor 168. If, in step 510, the temperature sensor 168 indicates to the controller 135 the occurrence of a change in temperature greater than a predetermined threshold, or a temperature excursion beyond a predetermined value or range, a determination is made in step 515 as to whether a DC offset compensation adjustment procedure, including steps 520-570, may be performed. For example, if the DBB RF transmitter 100 is processing the time-slot based communication signal 300 shown in FIG. 3, the process 500 will remain at step 515 until after the data in the first time slot 310 is processed and the guard period 305 begins before proceeding with the steps of the DC offset compensation adjustment procedure.

Steps 510 and 515 may be bypassed during initialization of the DBB RF transmitter 100, whereby the controller 135 may update the DC offset compensation values $K_1$ and $K_2$ prior to normal use of the DBB RF transmitter 100. Furthermore, a DC offset compensation value update may be performed repeatedly, periodically, in response to temperature monitored by the temperature sensor 168, or in accordance with another type of control scheme. For example, in step 510, a bias current detector or any other detector that detects a parameter that may affect the DC level characteristics of the I and Q signal components of the DBB RF transmitter 100 may be used, alone or in conjunction with the temperature sensor 168, to initiate the DC offset compensation adjustment procedure.

In step 520, the first actual step of making DC offset compensation adjustments is initiated by the controller 135 instructing switches 198A, 198B to disconnect the real and imaginary signal inputs of the digital DC offset compensation module 110 from the modem 105 and instead connecting the real and imaginary signal inputs of the digital DC offset compensation module 110 to the controller 135. Thus, no RF is input into the modulator 145 of the analog radio transmitter 125. In step 525, the controller 135 sets the DC offset compensation values $K_1$ and $K_2$ that are provided to the digital DC offset compensation module 110 to zero. Alternatively, the controller 135 may use the DC offset compensation adjustment procedure to adjust the existing values of $K_1$ and $K_2$. In step 530, the controller 135 sets the gain of the PA 150 to a maximum value via the amplitude control signal 196 to enhance the detection of small DC offset voltages.

In step 535, the controller 135 sets the imaginary signal input of the digital DC offset compensation module 110 to zero and applies a set of different DC offset voltages to the real signal input of the digital DC offset compensation module 110. In step 540, a first minimum detected reading for the real signal input is determined by the controller 135, at the LO frequency of the modulator 145 of the analog radio transmitter 125.

In step 545, the controller 135 sets the real signal input of the digital DC offset compensation module 110 to zero and applies a set of different DC offset voltages to the imaginary signal input of the digital DC offset compensation module 110. In step 550, a second minimum detected reading for the imaginary signal input is determined by the controller 135, at the LO frequency of the modulator 145 of the analog radio transmitter 125.

In step 555, new first and second DC offset compensation values $K_1$ and $K_2$ are determined by the controller 135 based on the first and second minimum detected readings, respectively. In step 560, the new first and second DC offset compensation values $K_1$ and $K_2$ are stored in the memory 140. In step 565, the new first and second DC offset compensation values $K_1$ and $K_2$ are provided to the digital DC offset compensation module 110. In step 570, the controller 135 instructs the switches 198A, 198B to disconnect the real and imaginary signal inputs of the digital DC offset compensation module 110 from the controller 135 and reconnects the real and imaginary signal inputs of the digital DC offset compensation module 110 to the modem 105. The process 500 then returns to step 505 until another temperature change or excursion is detected by temperature sensor 168, thus requiring another update of the DC offset compensation values $K_1$ and $K_2$.

Optionally, all or some of the foregoing steps of the DC offset compensation adjustment procedure may be performed in the digital domain. In this embodiment, for example, referring back to FIG. 1, the DAC 115 may be utilized to implement the DC offset corrections. Once the controller 135 determines the amount of DC offset correction required, this DC offset may be inserted digitally to the real and imaginary signal components of the DBB RF transmitter 100.

In an alternate embodiment, the controller 135 may be used in conjunction with a detection algorithm and the detector 165. The controller 135 simultaneously sweeps the DC level of the real and imaginary signal inputs of the digital DC offset compensation module 110. The algorithm determines at least one minimum detected reading by using a coordinate system application, whereby the DC levels of the real and imaginary signal inputs of the digital DC offset compensation module 110 are applied to an x-axis and y-axis, respectively, while detected readings sensed by the detector 165 are applied to a z-axis.

It should be noted that when the temperature threshold or excursion is exceeded, as detected in step 510, the controller 135 preferably sweeps through the DC levels to once again find the optimum setting. This cannot be done when signal transmission is in progress. However, if the direction of the DC drift with respect to temperature is known, then a correction based on a look up table (LUT) may be automatically applied without actually taking measurements. Preferably, the LUT is stored in the memory 140 and is accessed by the controller 135.

While this invention has been particularly shown and described with reference to preferred embodiments, it will be understood by those skilled in the art that various changes in form and details may be made therein without departing from the scope of the invention described hereinabove.

What is claimed is:

1. A digital baseband (DBB) transmitter comprising:
an analog radio transmitter having real and imaginary signal inputs;
a digital DC offset compensation module in communication with the analog radio transmitter and having real and imaginary signal inputs, the digital DC compensation module being configured to adjust the DC level of at least one of the real and imaginary signal inputs;
a controller in communication with the digital DC offset compensation module, the controller being configured to determine at least one DC offset compensation value used to suppress carrier leakage occurring in the analog radio transmitter, wherein the controller provides at least one DC offset signal to at least one of the real and imaginary signal inputs having a level that corresponds to the at least one DC offset compensation value;
a modem selectively connected to the real and imaginary signal inputs of the digital DC offset compensation module, the modem having real and imaginary signal outputs; and
first and second switches respectively connected to the real and imaginary signal outputs of the modem, the real and imaginary signal inputs of the digital DC offset compensation module and the controller, wherein the at least one DC offset compensation value is determined after the switches disconnect the modem from the real and imaginary signal inputs of the digital DC offset compensation module and connect the controller to the real and imaginary signal inputs of the digital DC offset compensation module.

2. The DBB transmitter of claim 1 further comprising:
a memory in communication with the controller, the memory for storing the at least one DC offset compensation value.

3. The DBB transmitter of claim 1 wherein the analog radio transmitter further includes a temperature sensor in communication with the controller, and the controller determines the at least one DC offset compensation value if the temperature sensor detects a change in temperature greater than a predetermined threshold, or a temperature excursion beyond a predetermined value or range.

4. The DBB transmitter of claim 1 wherein the DBB transmitter processes communication signals which include first and second time slots separated by a guard period, and the controller determines the at least one DC offset compensation value during at least a portion of the guard period.

5. The DBB transmitter of claim 1 wherein the digital DC offset compensation module comprises:
a first adder having a first input coupled to the real signal input of the digital DC offset compensation module and a second input coupled to the controller; and
a second adder having a first input coupled to the imaginary signal input of the digital DC offset compensation module and a second input coupled to the controller, wherein the controller provides respective DC offset signals to the second inputs of the first and second adders, the respective DC offset signals having levels which respectively correspond to a first and second DC offset compensation value determined by the controller.

6. The DBB transmitter of claim 1 wherein the controller sets previously determined DC offset compensation values to zero, prior to determining the at least one DC offset compensation value.

7. The DBB transmitter of claim 1 wherein the analog radio transmitter further comprises an amplifier, wherein the controller sets the amplifier to a maximum gain level, prior to determining the at least one DC offset compensation value.

8. The DBB transmitter of claim 1 wherein the controller disables the imaginary signal input of the digital DC offset compensation module and applies a set of different DC offset voltages to the real signal input of the digital DC offset compensation module.

9. The DBB transmitter of claim 8 wherein the set of different DC offset voltages is applied in accordance with a parabolic function, and the controller performs an interpolation of at least three measurement points on the parabolic function to determine a minimum detected reading associated with a minimum value of the parabolic function.

10. The DBB transmitter of claim 9 wherein the controller determines the DC offset compensation value based on the minimum detected reading.

11. The DBB transmitter of claim 10 wherein the analog radio transmitter includes a modulator having a local oscillator (LO) for outputting an LO signal at an LO frequency, and the minimum detected reading is determined for the real signal input at the LO frequency.

12. The DBB transmitter of claim 1 wherein the controller disables the real signal input of the digital DC offset compensation module and applies a set of different DC offset voltages to the imaginary signal input of the digital DC offset compensation module.

13. The DBB transmitter of claim 12 wherein the set of different DC offset voltages is applied in accordance with a parabolic function, and the controller performs an interpolation of at least three measurement points on the parabolic function to determine a minimum detected reading associated with a minimum value of the parabolic function.

14. The DBB transmitter of claim 13 wherein the controller determines the DC offset compensation value based on the minimum detected reading.

15. The DBB transmitter of claim 14 wherein the analog radio transmitter further includes a modulator having a local oscillator (LO) for outputting an LO signal at an LO frequency, and the minimum detected reading is determined for the imaginary signal input at the LO frequency.

16. A wireless transmit/receive unit (WTRU) comprising:
an analog radio transmitter having real and imaginary signal inputs;
a digital DC offset compensation module in communication with the analog radio transmitter and having real and imaginary signal inputs, the digital DC compensation module being configured to adjust the DC level of at least one of the real and imaginary signal inputs;
a controller in communication with the digital DC offset compensation module, the controller being configured to determine at least one DC offset compensation value used to suppress carrier leakage occurring in the analog radio transmitter, wherein the controller provides at least one DC offset signal to at least one of the real and imaginary signal inputs having a level that corresponds to the at least one DC offset compensation value;
a modem selectively connected to the real and imaginary signal inputs of the digital DC offset compensation module, the modem having real and imaginary signal outputs; and
first and second switches respectively connected to the real and imaginary signal outputs of the modem, the real and imaginary signal inputs of the digital DC offset compensation module and the controller, wherein the at least one DC offset compensation value is determined after the switches disconnect the modem from the real and imaginary signal inputs of the digital DC offset compensation module and connect the controller to the real and imaginary signal inputs of the digital DC offset compensation module.

17. The WTRU of claim 16 further comprising:
a memory in communication with the controller, the memory for storing the at least one DC offset compensation value.

18. The WTRU of claim 16 wherein the analog radio transmitter further includes a temperature sensor in communication with the controller, and the controller determines the at least one DC offset compensation value if the temperature sensor detects a change in temperature greater than a predetermined threshold, or a temperature excursion beyond a predetermined value or range.

19. The WTRU of claim 16 wherein the WTRU processes communication signals which include first and second time slots separated by a guard period, and the controller determines the at least one DC offset compensation value during at least a portion of the guard period.

20. The WTRU of claim 16 wherein the digital DC offset compensation module comprises:
a first adder having a first input coupled to the real signal input of the digital DC offset compensation module and a second input coupled to the controller; and
a second adder having a first input coupled to the imaginary signal input of the digital DC offset compensation module and a second input coupled to the controller, wherein the controller provides respective DC offset signals to the second inputs of the first and second adders, the respective DC offset signals having levels which respectively correspond to a first and second DC offset compensation value determined by the controller.

21. The WTRU of claim 16 wherein the controller sets previously determined DC offset compensation values to zero, prior to determining the at least one DC offset compensation value.

22. The WTRU of claim 16 wherein the analog radio transmitter further comprises an amplifier, wherein the controller sets the amplifier to a maximum gain level, prior to determining the at least one DC offset compensation value.

23. The WTRU of claim 16 wherein the controller disables the imaginary signal input of the digital DC offset compensation module and applies a set of different DC offset voltages to the real signal input of the digital DC offset compensation module.

24. The WTRU of claim 23 wherein the set of different DC offset voltages is applied in accordance with a parabolic function, and the controller performs an interpolation of at least three measurement points on the parabolic function to determine a minimum detected reading associated with a minimum value of the parabolic function.

25. The WTRU of claim 24 wherein the controller determines the DC offset compensation value based on the minimum detected reading.

26. The WTRU of claim 25 wherein the analog radio transmitter includes a modulator having a local oscillator (LO) for outputting an LO signal at an LO frequency, and the minimum detected reading is determined for the real signal input at the LO frequency.

27. The WTRU of claim 16 wherein the controller disables the real signal input of the digital DC offset compensation module and applies a set of different DC offset voltages to the imaginary signal input of the digital DC offset compensation module.

28. The WTRU of claim 27 wherein the set of different DC offset voltages is applied in accordance with a parabolic function, and the controller performs an interpolation of at least three measurement points on the parabolic function to determine a minimum detected reading associated with a minimum value of the parabolic function.

29. The WTRU of claim 28 wherein the controller determines the DC offset compensation value based on the minimum detected reading.

30. The WTRU of claim 29 wherein the analog radio transmitter further includes a modulator having a local oscillator (LO) for outputting an LO signal at an LO frequency, and the minimum detected reading is determined for the imaginary signal input at the LO frequency.

31. An integrated circuit (IC) comprising:
an analog radio transmitter having real and imaginary signal inputs;
a digital DC offset compensation module in communication with the analog radio transmitter and having real and imaginary signal inputs, the digital DC compensation module being configured to adjust the DC level of at least one of the real and imaginary signal inputs;
a controller in communication with the digital DC offset compensation module, the controller being configured to determine at least one DC offset compensation value used to suppress carrier leakage occurring in the analog radio transmitter, wherein the controller provides at least one DC offset signal to at least one of the real and imaginary signal inputs having a level that corresponds to the at least one DC offset compensation value;
a modem selectively connected to the real and imaginary signal inputs of the digital DC offset compensation module, the modem having real and imaginary signal outputs; and
first and second switches respectively connected to the real and imaginary signal outputs of the modem, the real and imaginary signal inputs of the digital DC offset compensation module, wherein the at least one DC offset compensation value is determined after the switches disconnect the modem from the real and imaginary signal inputs of the digital DC offset compensation module and connect the controller to the real and imaginary signal inputs of the digital DC offset compensation module.

32. The IC of claim 31 further comprising:
a memory in communication with the controller, the memory for storing the at least one DC offset compensation value.

33. The IC of claim 31 wherein the analog radio transmitter further includes a temperature sensor in communication with the controller, wherein the controller determines the at least one DC offset compensation value if the temperature sensor detects a change in temperature greater than a predetermined threshold, or a temperature excursion beyond a predetermined value or range.

34. The IC of claim 31 wherein the IC processes communication signals which include first and second time slots separated by a guard period, and the controller determines the at least one DC offset compensation value during at least a portion of the guard period.

35. The IC of claim 31 wherein the digital DC offset compensation module comprises:

a first adder having a first input coupled to the real signal input of the digital DC offset compensation module and a second input coupled to the controller; and
a second adder having a first input coupled to the imaginary signal input of the digital DC offset compensation module and a second input coupled to the controller, wherein the controller provides respective DC offset signals to the second inputs of the first and second adders, the respective DC offset signals having levels which respectively correspond to a first and second DC offset compensation value determined by the controller.

36. The IC of claim 31 wherein the controller sets previously determined DC offset compensation values to zero, prior to determining the at least one DC offset compensation value.

37. The IC of claim 31 wherein the analog radio transmitter further comprises an amplifier, wherein the controller sets the amplifier to a maximum gain level, prior to determining the at least one DC offset compensation value.

38. The IC of claim 31 wherein the controller disables the imaginary signal input of the digital DC offset compensation module and applies a set of different DC offset voltages to the real signal input of the digital DC offset compensation module.

39. The IC of claim 38 wherein the set of different DC offset voltages is applied in accordance with a parabolic function, and the controller performs an interpolation of at least three measurement points on the parabolic function to determine a minimum detected reading associated with a minimum value of the parabolic function.

40. The IC of claim 39 wherein the controller determines the DC offset compensation value based on the minimum detected reading.

41. The IC of claim 40 wherein the analog radio transmitter includes a modulator having a local oscillator (LO) for outputting an LO signal at an LO frequency, and the minimum detected reading is determined for the real signal input at the LO frequency.

42. The IC of claim 31 wherein the controller disables the real signal input of the digital DC offset compensation module and applies a set of different DC offset voltages to the imaginary signal input of the digital DC offset compensation module.

43. The IC of claim 42 wherein the set of different DC offset voltages is applied in accordance with a parabolic function, and the controller performs an interpolation of at least three measurement points on the parabolic function to determine a minimum detected reading associated with a minimum value of the parabolic function.

44. The IC of claim 43 wherein the controller determines the DC offset compensation value based on the minimum detected reading.

45. The IC of claim 44 wherein the analog radio transmitter further includes a modulator having a local oscillator (LO) for outputting an LO signal at an LO frequency, and the minimum detected reading is determined for the imaginary signal input at the LO frequency.

* * * * *